United States Patent [19]

Burkman et al.

[11] Patent Number: 4,801,335
[45] Date of Patent: Jan. 31, 1989

[54] RINSING IN ACID PROCESSING OF SUBSTRATES

[75] Inventors: Don C. Burkman, Excelsior; David D. Schumacher, Plymouth; Charlie A. Peterson, Waconia, all of Minn.

[73] Assignee: FSI Corporation, Chaska, Minn.

[21] Appl. No.: 920,516

[22] Filed: Dec. 12, 1986

Related U.S. Application Data

[62] Division of Ser. No. 626,702, Jul. 2, 1984, Pat. No. 4,682,615.

[51] Int. Cl.$^4$ .............................................. B08B 9/04
[52] U.S. Cl. .................................... 134/25.4; 134/34
[58] Field of Search .................... 134/26, 1, 34, 25.1, 134/25.4

[56] References Cited

U.S. PATENT DOCUMENTS

| | | | |
|---|---|---|---|
| 2,369,358 | 2/1945 | Lathrop et al. | 134/199 |
| 2,609,827 | 9/1952 | Christi | 134/102 |
| 3,012,921 | 12/1961 | Vau Ghan | 134/199 |
| 3,489,608 | 1/1970 | Jacobs et al. | 134/25 |
| 3,719,191 | 3/1973 | Zimmerly | 134/102 |
| 3,990,462 | 11/1976 | Eftmann et al. | 134/102 |
| 4,027,686 | 6/1977 | Shortes et al. | 134/21 |
| 4,132,567 | 1/1979 | Blackewood | 134/1 |
| 4,221,228 | 9/1980 | Stoffel et al. | 134/199 |
| 4,286,541 | 9/1981 | Blackwood | 118/52 |
| 4,429,983 | 2/1984 | Cortellino et al. | 354/320 |
| 4,643,774 | 2/1987 | Kishida et al. | 134/37 |

FOREIGN PATENT DOCUMENTS 1296113 7/1965 Fed. Rep. of Germany .

Primary Examiner—H. M. S. Sneed
Assistant Examiner—Sharon T. Cohen
Attorney, Agent, or Firm—Palmatier & Sjoquist

[57] ABSTRACT

In a chemical processing system for processing substrates or wafers in the production of electronic devices or integrated circuit chips, a rinsing step of simultaneously thoroughly rinsing the substrate in the processing chamber while the chemical supply lines and chemical spray posts are also being thoroughly rinsed with rinse water directed down a drain and without spraying into the processing chamber by controlling the pressure or rate of flow of rinsing water through the liquid chemical supply lines and chemical spray post passages and orifices so that most of the rinsing water will flow through an open drain valve and down the drain and only a trickle of water is permitted to flow outwardly through the spray orifices of the chemical spray post so that none of the rinsing water with dilute traces of chemical is sprayed onto the substrates in the processing chamber. A separate and dedicated rinsing water spray post or head is provided for directing rinsing water atomized by inert gas such as nitrogen to instantaneously commence rinsing of the wafers in the processing chamber. The liquid chemical spray posts are provided with pipe connections to the chemical supply passages within the spray post to accommodate rinsing water flow through the passage and out through the drain ducts and through an openable drain valve to a drain so that rinsing water may freely flow through the chemical supply lines and chemical supply passages in the chemical spray heads simultaneously with the application of rinsing water from the dedicated rinsing water spray post on the chamber wall.

6 Claims, 2 Drawing Sheets

RINSING IN ACID PROCESSING OF SUBSTRATES

This is a division of application Ser. No. 626,702 filed on July 2, 1984 now U.S. Pat. No. 4,682,615.

BACKGROUND OF THE INVENTION

This invention relates to a chemical processing system for processing substrates such as silicon wafers in the manufacture of electronic devices such as integrated circuit chips.

In the processing of substrates or wafers in the manufacture of electronic devices such as integrated circuit chips, a chemical processing system is used which requires the application, in sequence, of a number of different chemicals to the substrate of being processed. Some of the chemicals are applied alone, and others are mixed together. Such acids are hydrochloric acid, sulfuric acid, nitric acid and hyrogen fluoride are applied to the wafers in processing steps, and may in some steps be mixed with such others chemicals as hydrogen peroxide.

Nitrogen gas under pressure is also applied at the liquid nozzles in order to atomize the liquid chemicals as they are directed into the processing chamber and toward the substrates in order to thoroughly drench the wafers and assure that full coverage by the liquid chemical is obtained. Water is also used as a rinsing agent to clean the substrates between the process steps and to purge the chemical lines or ducts of liquid chemicals.

In processing of such substrates, the substrates may be held stationary, or may be revolved, and in some instances processing of wafers is done one at a time, and in other instances batches of wafers are processed simultaneously in a processing chamber. Also, the spray parts which direct the spray of chemical and water into the processing chamber may be located at the peripheral wall of the chamber, but the spray posts may also be located approximately at the center of the chamber and directing sprays outwardly, in a general radial direction therefrom, as to apply the sprays of liquids and water to the wafers in the chamber.

It is essential that the chemical delivery lines which supply chemicals to the spray post be rinsed out between successive chemical steps in the process, in order to prevent chemical reactions leading to precipitates and other detrimental by-products, which might be produced if chemicals used in successive steps were allowed to mix with each other. For these same reasons, it is also essential to assure that the chemicals applied to the substrates in each step are thoroughly rinsed off prior to applying chemicals in subsequent steps.

In the past, it has been conventional to supply liquid chemicals, and nitrogen gas into a spray post for directing the liquid spray into the processing chamber and simultaneously, with the nitrogen under pressure, to break up the spray particles and effectively atomize the liquid spray in the chamber in order to thoroughly drench the substrate during the chemical step.

When the chemical step has been completed, it has been conventional practice to terminate the flow of the liquid chemical into the chemical lines, and simultaneously direct water into the chemical lines under pressure so as to gradually purge liquid chemicals from the supply lines and from the nozzle orifices; and while this purging has continued, the concentration of liquid chemicals being applied to the substrates in the processing chamber is gradually diminished. Simultaneously with the application of rinsing water to the chemical lines, rinsing water is also applied from a separate nozzle or series of nozzles which emanate a fan shaped spray of rinsing water into the pressure chamber. This fan shape spray of rinsing water has not been atomized and is therefore not adequate for throughly rinsing the wafers, but the rinsing of the wafers depends on the atomized spray from the chemical spray post, now emanating atomized water. It has been recognized that the rinsing of the chemical delivery lines must be first accomplished and subsequently the rinsing of the substrates with atomized water from the chemical supply post is then subsequently accomplished. This two step rinsing, first of the chemical delivery lines and then of the substrates has taken an excessive length of time to essentially slow down the overall processing of the substrates; and the previous rinsing procedure also has the disadvantage of not defining a specific termination of application of the chemical to the substrates in that the chemical is continuing to be applied to the substrates until the purging water has diluted the chemicals in the lines so that no more such chemical exists.

SUMMARY OF THE INVENTION

An object of the invention is the provision in a chemical processing system for substrates, of an improved rinse cycle and apparatus therefore in order to accelerate the rinsing procedure and to more accurately control the termination of the chemical processing of by almost instantaneous commencement of the rinsing of the substrates.

A feature of the invention is the provision in a chemical processing system for substrates, of an improved rinsing process when at the end of a chemical processing step, the application of the liquid chemicals to the substrates is terminated almost simultaneously, and rinsing water is supplied under low pressure through the chemical supply lines and the chemical orifices of the chemical spray post to purge the diluting liquid chemicals from the supply lines and directly to a drain, and with only sufficient pressure at the spray nozzle as to cause the purging water and diluting liquid chemicals to dribble or trickle from the spray orifices that without being cast onto the substrates in the spray processing chamber; and substantially simultaneously with the application of the rinsing water to the chemical supply lines, also suppling a rinsing water through spray orifice continuously dedicated to rinsing water, and atomizing such rinsing water for application to the substrates to the processing chamber.

Another feature of the invention is the provision in a processing chamber of separate spray posts or heads for liquid chemical and rinsing water respectively; each of the spray posts or heads having nitrogen ports for gas to atomize the liquid chemical and rinsing water sprays emanating therefrom; and the provision of a pressure regulating device in the water source line connected with the chemical supply line, and a drain valve adjacent the chemical spray post for directing all of the liquid from the chemical supply lines including the diluting chemicals and rinsing water into the drain after the liquid has purged through the spray post manifolds and supply lines.

By reason of the improvements in the process, rinsing water, atomized by nitrogen, from the dedicated rinse water spray post or head is directed onto the substrates in the processing chamber immediately after the termination of the flow of liquid chemical; and while the rinsing of the substrates progresses, the chemical supply lines are simultaneously being rinsed, but without continuing to direct the liquid chemical, although it may be rapidly diluting, onto the substrate onto the processing chamber.

The present invention provides two principle advantages. Firstly, the rinsing cycle is substantially shortened because the rinsing of the substrates and the rinsing of the chemical supply lines occurs simultaneously; and further, the chemical processing step in the substrate sequence, has a definite termination, for thereby improving the overall processing control.

DETAILED SPECIFICATION

Figure 1:
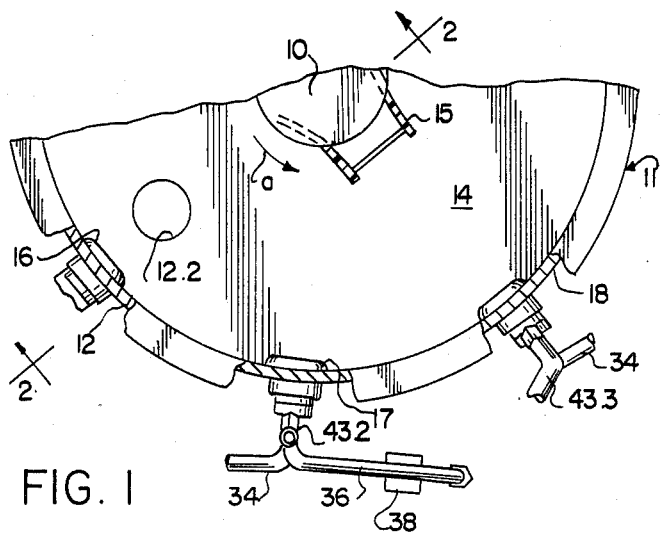
FIG. 1 is a detailed top plan view of a processing chamber used in acid processing system with the cover removed.

One form of the invention is shown in the drawings and is described herein.

The chemical processing of substrates 10 is carried out in a closed container indicated in general by numeral 11 and including a bowl or housing 12 preferably formed of material which is highly resistive to corrosive chemicals, and is usually made of stainless steel. The bowl has a hinged cover 13 as to define a closed chamber 14 in which the processing of the substrates is carried on.

The substrates 10, in most cases, are silicon wafers to which various films are applied in the manufacture of electronic devices, usually integrated circuit chips. In the form of housing illustrated, the substrates 10 are confined in a carrier or cassette 15 which holds the substrates in spaced confronting relation with each other and at the center of the chamber 14. The cassette is mounted in the chamber 14 to be rotatable therein as indicated by the arrows a. In other forms of processing chambers, the chamber may be substantially smaller for a single substrate or wafer, and wherein the single substrate or wafer may be rotated or may be held stationary during processing.

The processing of such substrates 10 requires the application of a series of processing chemicals in a sequence of processing steps. Each processing step, involving the use of one or more liquid chemicals, is separated from the following processing step by a thorough rinsing of the wafers to remove all traces of the liquid chemicals and also to prevent the formation of any precipitates on the wafers which might occur as a result of mixing chemicals.

Liquid chemicals are applied onto the substrates 10 from a pair of spray posts or spray heads 16 and 17, which are identical to each other, so that a description and understanding of one of the spray posts or heads 16, 17 will suffice for an understanding of both of the spray posts or heads 16, 17.

A separate rinse water spray post or head 18 is also provided for exclusively spraying rinsing water toward the substrates 10. The rinse water spray post or head 18 is identical to the chemical spray post or heads 16, 17, except for the piping of flow connections thereto. Accordingly, an understanding of the specific construction of one of the spray posts or heads 16, 17 and 18 will suffice for an understanding of all of the spray posts or heads 16, 17, 18.

The bowl 12 has a bottom wall 12.1, upon which all of the liquids sprayed into the chamber 14 are collected; and the bottom wall 12.1 is sloped to a drain 12.2 to immediately carry away all of the spent processing liquids, rinsing water, and various particulates.

Spray post 16 is typical of the other spray posts 17 and 18, and has an elongate body 19 which extends through an elongate slot-like opening in the bowl wall 12.3. The spray post body has a front flange 20 which, together with a sealing gasket 21, bears against the inner surface of the bowl sidewall, and is clamped therein by a bracket structure 22 at the outer side of the bowl sidewall.

The spray post body 19 and the gasket 21 are both made of plastic of a type which is highly inert and resistant to highly active or corrosive chemicals, and is preferably formed of a plastic known generically as tetrapolyethylene and by its commercial trademark, Teflon, of the duPont Company of Wilmington, Del.

Figure 6:
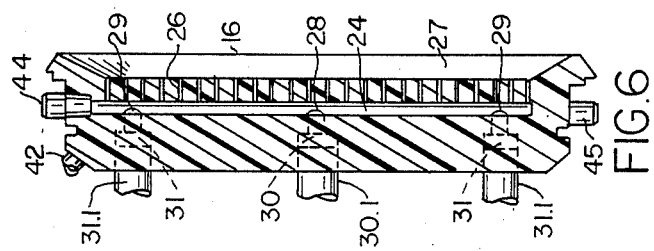
FIG. 6 is a detail section view taken approximately at 6—6 of FIG. 5.
Figure 5:
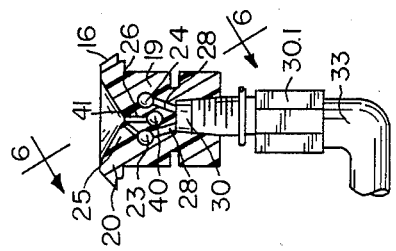
FIG. 5 is a enlarged detail section view taken approximately at 5—5 in FIG. 3.

The elongate spray post body 19 has a pair of liquid passages or manifolds 23 and 24 extending longitudinally, substantially throughout the entire length thereof, as seen in FIG. 6. The liquid passages or manifolds 23 and 24 supply the liquid to a multiplicity of liquid spray orifices 25 and 26 which intersect and communicate with the flow passages 23 and 24 respectively, and also open through the front face 27 of the spray post which is located at the side of the chamber 14 of the closed container. It will be recognized in FIG. 5, that the liquid spray orifices 25 and 26 are oriented in converging relation with each other so that the sprays of liquids emanating from the orifices 25 and 26 intersect each other a short distance from the outlet ends of these orifices.

The liquid passages or manifolds 23 and 24 intersect with a plurality of flow ducts 28 and 29 respectively located at intermediate and end portions of the flow passages 23, 24 and which intersect with inlet or supply port 30 and discharge ports 31, respectively.

In all of the spray posts or spray heads 16, 17 and 18, liquid is supplied to the inlet port 30, and accordingly, the liquid chemical spray posts 16 and 17 have inlet fittings 30.1 in the port 30 and connecting to liquid chemical supply lines 33 and 34, respectively. The inlet port 30 of the rinsing water spray post 18 has a fittig 30.2 in the inlet port 30 and connected to a rinsing water supply line 34.

Figure 4:
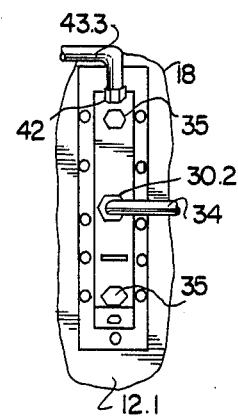
FIG. 4 is a detail elevation view of the rinsing spray post and duct connections therefore.
Figure 2:
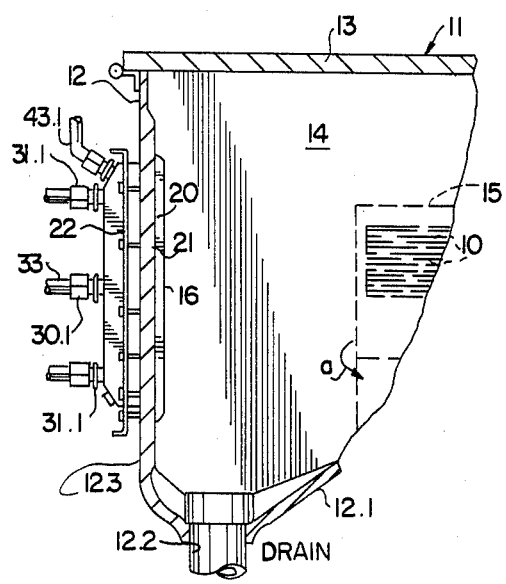
FIG. 2 is a detailed section view taken approximately at 2—2 of FIG. 1.
Figure 3:
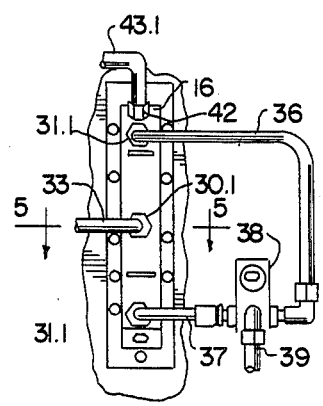
FIG. 3 is a detail elevation view of one of the wall mounted chemical spray posts and the duct connections therefore.

In the rinsing water spray post or head 18, the discharge ports 31 are closed by plugs 35 as seen in FIG. 4. The discharge ports 31 in liquid chemical spray posts or heads 16 and 17 have fittings 31.1 therein. The fittings 31.1 are connected to discharge or shunt pipes 36 and 37 which respectively connect the upper and lower ends of the spray posts 16, 17, with drain valves 38, the discharge from which is connected to an open drain 39.

The valves 38 and solenoid operated valves, normally closing the discharge pipes 36, but opening when actuated to connect the discharge pipes 36 and 37 to the drain 39.

The spray post body 16 also has an elongate passage or manifold 40 for carrying inert gas such as nitrogen, and a multiplicity of gas jetting orifices 41 communicating with the passage 40 and extending to and opening through the front face 27 of the spray post body. The passage 40 extends parallel to and between the passages or manifolds 23, 24, and the orifices 41 extend to the front face of the spray post between the orifices 25 and 26, in a symmetrical arrangement as to bisect the angle between the rows of orifices 25, 26. The jets of gas emanating from the orifices 41 intersect with the sprays of liquids from the orifices 25, 26 and cause atomizing of the liquid sprays from the orifices 25, 26, as to create a directional fog-like spray in the chamber 14 and directed to the substrates 10.

A gas supply fitting 42 in a port of the spray post body 16 connects the passage or manifold 40 with the gas supply line or pipe 43.1. The spray posts or heads 17 and 18 have their respective gas passages or manifolds 40 connected to gas supply lines 43.2 and 43.3.

In FIG. 6, it will be seen that a stopper or closure 44 is inserted into the upper ends of the two liquid flow passages or manifolds 23, 24; and a similar stopper or closure 45 closes the lower ends of the gas passage or manifold 40. These stoppers or closures 44 and 45 are required because the several passages 23, 24 and 40 are formed by drilling the spray post body and must be closed in order for the passages to function as described.

Figure 7:
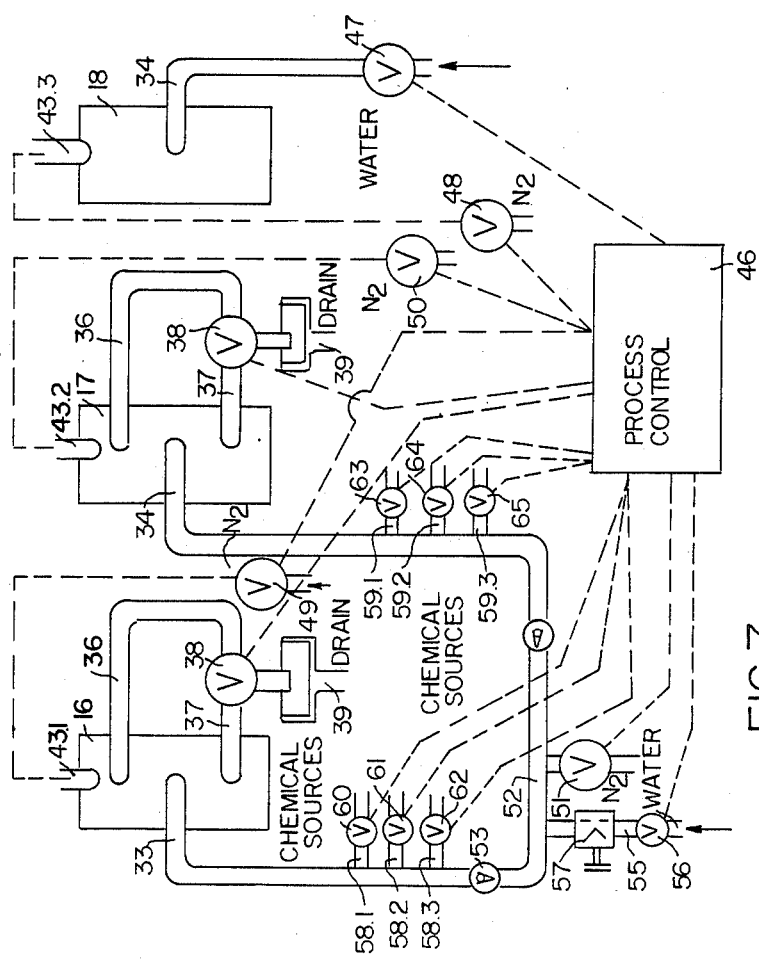
FIG. 7 is a schematic diagram of relevant portions of the operating system.

With reference to FIG. 7 which shows, schematically, the connections to the spray posts or heads 16, 17 and 18, it will be recognized that a central process control 46 is used to open and close the several valves such as valves 38, in the proper sequence for carrying out the processing of the substrates 10 in the chamber 14. Of course, the process control 46 provides the reliable operation of all of the valves as a substitute for manual control which could be effective. No detail understanding of the process controls is needed for an understanding of the present invention. Of course, all of the valves described herein, except where noted, are solenoid valves so that they may be electrically operated.

The rinsing water spray post 18 is supplied with rinsing water from the supply line 34 which is controlled by a valve 47 which opens and closes to turn the rinsing water on and off from the source. The flow of inert gas or nitrogen to the rinsing water spray post 18 through the supply line 43.3 is controlled by a valve 48 which is opened and closes to start and stop the flow of nitrogen to the spray post.

The nitrogen supply lines 43.1 and 43.2 for spray posts 16 and 17 are controlled by valves 49 and 50 which open and close to supply and stop flow of nitrogen to the spray posts from the source. One additional gas valve 51 is connected to a manifold pipe or line 52 which connects to the two liquid chemical supply lines 33 and 34 through check valves 53 and 54, respectively. The gas valve 51 opens and closes to start and stop flow of nitrogen or inert gas to the supply lines from the gas source.

A rinsing water supply line 55 is controlled by a valve 56 for turning the rinsing water on and off from the source, and is connected through a variable flow restriction in the form of a needle valve 57, and to the manifold pipe 52 in order to supply rinsing water, as desired, into the chemical supply lines 33 and 34. The needle valve 57 is manually adjustable to increase or decrease the rate of flow of rinsing water through the liquid chemical supply lines 33, 34, and through the passages 23, 24 in the spray posts 16, 17 and through the spray orifices 25 and 26. The needle valve 57 is adjusted as to produce flow, when the drain valves 38 are opened, so that rinsing water will freely flow through the liquid chemical supply lines 33, 34 and through the spray post passages or manifolds 23, 24 and through the drain or discharge lines 36, 37, and through the drain valves 38 to the drain 39; and the rate of flow and pressure in the passages 23, 24 is adjusted by the needle valve 57 as to cause only a trickle or dribble of flow through the spray orifices 25 and 26, when the drain valves 38 are open, without causing any of the liquid in orifices 25, 26 to spray out onto the substrates 10, but only allowing such trickle of rinsing water as flows through the orifices 25, 26 to run down the front faces 27 of the spray posts or fall to the bottom wall 12.1 of the housing 12 without reaching the substrates 10.

A number of branch supply lines 58.1, 58.2, 58.3 and 59.1, 59.2, 59.3 are respectively connected to the supply lines 33 and 34 for connecting the supply lines to sources of various chemicals through on-off valves 60, 61 and 62 which control chemicals for the supply line 33, and on-off valves 63, 64 and 65 which control flow of the liquid chemicals into supply line 34. The sources of liquid chemicals are usually canisters of such chemicals which are to be replaced from time to time as the supplies of chemicals therein are spent.

Depending upon the particular process being carried out, various individual chemicals from the various sources are supplied through the spray posts 16, 17. Typical of the chemicals that may be supplied through the several valves 60–65, are sulfuric acid, hydrochloric acid, dilute hydrogen fluoride, nitric acid, ammonium hydroxide and hydrogen peroxide, and similar types of highly active and highly corrosive chemicals.

During a normal liquid chemical processing step during the processing of the substrates 10, the rinsing water valves 47 and 56 are closed, the inert gas or nitrogen valves 48 and 51 are closed, and both drain valves 38 are closed.

One or more of the liquid chemical source valves 60–65 may be opened as to supply liquid chemical through the respective spray post or head 16, 17. If two chemicals are being mixed, one of the liquid chemical source valves 60–62 and one of the liquid chemical source valves 63–64 are opened as to supply liquid chemical into both of the spray posts or heads 16, 17. Simultaneously with the supplying of liquid chemical to a spray post, the valve 49 or 50 of the corresponding nitrogen supply line for that spray post is opened as to supply inert gas or nitrogen under pressure to the spray post.

After the substrates 10 in the chamber have been subjected to the liquid chemical spray for the proper period of time, the flow of liquid chemical is stopped and the rinsing step commences immediately.

During the rinsing step of the substrate processing, a particular feature is the simultaneous application of rinsing water sprayed from the rinsing water spray post 18 and atomized by the inert gas therefrom; and the application of rinsing water through the flow restriction 57, the chemical supply lines 33 and 34, liquid passages or manifolds 23 and 24 in both of the spray posts 16 and 17 and flow through the drain or discharge ducts 36, 37 and through the open drain valves 38 to the open drain 39 with only sufficient pressure and flow rate permitted by the needle valve 57 as to allow a slow trickle through the spray orifices 25 and 26, and without casting spray from the orifices to the substrate 10. It will be understood that during this rinsing of the chemical flow lines and passages 23, 24 and orifices 25, 26, the nitrogen valves 49, 50 for the spray posts 16, 17 are closed.

This described operation produces simultaneous rinsing of the substrates 10 and of the chemical flow lines 33, 34 and of the chemical spray posts 16, 17. As a result, the rinsing step in the processing is substantially shortened in time; and because of the application of atomized rinsing water from the dedicated rinsing water spray post 18, onto the substrates 10, the processing of the substrates is almost instantaneously terminated because of the rapid dilution of any liquids that actually may be on the substrates.

It has been found helpful, in certain conditions, to close the water supply valve after a period of time to allow the spray posts 16 and 17 to drain thoroughly through the open drain valves 38 and open drain 39, while the rinsing water spray post 18 continues to drench the substrates with atomized rinsing water; and then while atomized rinsing water from the rinsing water spray post 18 continues to drench the substrates, the rinsing water may be reapplied through the chemical supply lines 33, 34 and the chemical spray posts 16, 17 as previously described. The water valve 56 may be closed and opened several times to repeat the rinsing process in the chemical supply lines and chemical spray posts 16, 17.

The featured rinsing steps as described may be briefly preceded as the rinsing commences, by a brief water purge for a few seconds of the chemical supply lines 33, 34 and chemical spray nozzles 16, 17, but without gas through the supply lines 43.1, 43.2; and simultaneously, applying atomized rinsing water from the rinsing water spray post 18 as previously described. After the short purge of the chemical supply lines 33, 34 and chemical spray posts 16, 17, the rinsing water valve 56 may be closed again; and a short inert gas or nitrogen purge may be effected by opening the nitrogen supply valve 51 to purge the chemical supply lines 33, 34 and the liquid passages 23, 24 and orifices 25, 26 of the chemical spray posts 16, 17. The preliminary water purge may continue only briefly as for ten seconds; and the nitrogen purge may also continue only briefly as for approximately ten seconds before the drain valve 38 is subsequently opened and rinsing water is supplied to the chemical supply lines 33, 34 and chemical spray posts 16, 17 as previously described, only allowing a trickle of water to emanate from the spray orifices 25, 26, without jetting inert gas or nitrogen.

When the simultaneous rinsing of the substrates and of the supply lines and chemical spray posts has been completed, the processing of the substrates 10 may continue by supplying an additional chemical or mixture of chemicals onto the substrates.

I claim:

1. In the liquid chemical processing of substrates in a closed chamber with means providing rinsing spray orifices directed toward the substrate and chemical orifices also directed toward the substrate and in flow communication with chemical supply lines and spray head chemical passages, an improved rinsing method consisting in spraying rinsing liquid from the rinsing spray orifices toward and onto the substrate in the closed chamber to drench the substrate with such rinsing liquid to terminate the chemical processing by rinsing away such processing chemicals and any particulate that may exist on such substrates while allowing the rinsing liquid to exit the chamber, and simultaneously with said spraying, clearing the chemical supply lines, chemical passages and chemical orifices by supplying additional rinsing liquid into the chemical supply lines, spray head chemical passages and chemical orifices, to mix with and progressively dilute the liquid chemical therein and directing the mixture of rinsing liquid and liquid chemical through the lines and passages into an open drain while applying pressure on the additional rinsing liquid, as to move the mixture through the lines and passages and drain, and as to trickle the mixture through and from the chemical orifices without spraying the mixture onto the substrates.

2. The improved rinsing method as set forth in claim 1 and terminating the supplying of the additional rinsing liquid into the lines, passages and orifices and allowing substantial completion of flow of such rinsing liquid into the open drain, and repeating such supplying of additional rinsing liquid into the lines, passages and orifices, and directing the liquid into the open drain.

3. The improved rinsing method as set forth in claim 1 and prior to such supplying the additional rinsing liquid at said pressure and directing the mixture into the open drain, the added step of purging such lines, passages and chemical orifices with rinsing liquid.

4. The improved rinsing method as set forth in claim 1 and prior of the steps of supplying the additional liquid at said pressure and directing the mixture into the open drain, the added step of purging the lines, passages and chemical orifices with inert gas.

5. The improved rinsing method according to claim 3 and after said added step but before said steps of supplying and directing, another step including stopping the flow of additional rinsing liquid and purging the lines, passages and chemical orifices with inert gas and thereafter stopping the gas purge.

6. The improved rinsing method according to claim 1 and stopping the flow of liquid chemicals to the chemical orifices whereby to stop the spray of chemicals therefrom, and commencing the spraying of rinsing liquid in coordinated relation with stopping the flow of liquid chemicals.

* * * * *